(12) United States Patent
Chen

(10) Patent No.: US 10,522,711 B2
(45) Date of Patent: Dec. 31, 2019

(54) MANUFACTURING METHOD OF QUANTUM DOT, LIGHT-EMITTING MATERIAL, LIGHT-EMITTING DEVICE, AND DISPLAY APPARATUS

(71) Applicant: Chi Mei Corporation, Tainan (TW)

(72) Inventor: Wei-Ta Chen, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 16/053,812

(22) Filed: Aug. 3, 2018

(65) Prior Publication Data

US 2019/0044025 A1 Feb. 7, 2019

(30) Foreign Application Priority Data

Aug. 4, 2017 (TW) .............................. 106126318 A

(51) Int. Cl.
*H01L 33/08* (2010.01)
*H01L 33/06* (2010.01)
*H01L 33/56* (2010.01)
*C09K 11/88* (2006.01)
*B82Y 30/00* (2011.01)
*B82Y 40/00* (2011.01)

(52) U.S. Cl.
CPC .............. *H01L 33/06* (2013.01); *H01L 33/56* (2013.01); *B82Y 30/00* (2013.01); *B82Y 40/00* (2013.01); *C09K 11/883* (2013.01)

(58) Field of Classification Search
CPC .......................... H01L 29/0665; B82B 3/0033
See application file for complete search history.

(56) References Cited

U.S. PATENT DOCUMENTS

| 8,460,632 | B2 | 6/2013 | Kang et al. | |
|---|---|---|---|---|
| 2008/0083950 | A1* | 4/2008 | Pan | B82Y 10/00 257/347 |
| 2011/0223097 | A1* | 9/2011 | Han | B82Y 30/00 423/509 |
| 2011/0227007 | A1 | 9/2011 | Kang et al. | |
| 2015/0076494 | A1* | 3/2015 | Pickett | H01L 21/02565 257/43 |
| 2015/0299567 | A1* | 10/2015 | McDaniel | C09K 11/881 252/301.65 |
| 2015/0315721 | A1* | 11/2015 | Zhong | B82Y 10/00 117/68 |

(Continued)

FOREIGN PATENT DOCUMENTS

| CN | 102199425 | 9/2011 |
|---|---|---|
| CN | 106433640 | 2/2017 |
| CN | 106590633 | 4/2017 |

*Primary Examiner* — George R Fourson, III
(74) *Attorney, Agent, or Firm* — JCIPRNET

(57) ABSTRACT

A manufacturing method of a quantum dot, a light-emitting material, a light-emitting device, and a display apparatus are provided. The manufacturing method of a quantum dot includes the following steps. A first solution including at least one element selected from the group consisting of an element in Group XII and an element in Group XIII is provided. A second solution including at least one element selected from the group consisting of an element in Group XV and an element in Group XVI is provided. The first solution and the second solution are mixed. A thermal treatment is performed on the mixed solution. A range of the heating rate of the thermal treatment is 2° C./min to 10° C./min.

16 Claims, 3 Drawing Sheets

(56) References Cited

U.S. PATENT DOCUMENTS

| | | | |
|---|---|---|---|
| 2015/0361334 A1* | 12/2015 | Kwon | H01L 51/0045 |
| | | | 252/301.16 |
| 2017/0247614 A1* | 8/2017 | Li | C09K 11/883 |
| 2018/0016495 A1* | 1/2018 | Kim | C09K 11/7492 |
| 2018/0252864 A1* | 9/2018 | Yang | G02B 6/0229 |
| 2019/0112523 A1* | 4/2019 | Kim | C09K 11/02 |
| 2019/0136130 A1* | 5/2019 | Han | B82Y 5/00 |

* cited by examiner

MANUFACTURING METHOD OF QUANTUM DOT, LIGHT-EMITTING MATERIAL, LIGHT-EMITTING DEVICE, AND DISPLAY APPARATUS

CROSS-REFERENCE TO RELATED APPLICATION

This application claims the priority benefits of Taiwan application serial no. 106126318, filed on Aug. 4, 2017. The entirety of the above-mentioned patent application is hereby incorporated by reference herein and made a part of specification.

BACKGROUND

Field of the Invention

The disclosure relates to a manufacturing method of a light-emitting material, and more particularly, to a manufacturing method of a light-emitting material containing a quantum dot.

Description of Related Art

A quantum dot is a semiconductor light-emitting material having a band gap that can be changed with its grain size. As a result, an emission wavelength of the quantum dot can be adjusted by changing a size of the quantum dot. The quantum dot has high color purity and high color saturation, and therefore has gradually been applied in the art of display panels in recent years. A quantum yield is one of the important characteristics of the quantum dot, and represents an efficiency of a conversion from absorbed light into fluorescent light done by the quantum dot. Therefore, a topic regarding methods of increasing the quantum yield of the quantum dot becomes important in the art.

SUMMARY

The disclosure provides a manufacturing method of a quantum dot that can improve a quantum yield of the quantum dot.

The manufacturing method of a quantum dot of the disclosure includes the following steps. A first solution including at least one element selected from the group consisting of an element in Group XII and an element in Group XIII is provided. A second solution including at least one element selected from the group consisting of an element in Group XV and an element in Group XVI is provided. The first solution and the second solution are mixed to form a mixed solution. A thermal treatment is performed on the mixed solution, so as to form a quantum dot. The range of the heating rate of the thermal treatment is 2° C./min to 10° C./min.

Based on the above, the manufacturing method of a quantum dot of the disclosure includes performing the thermal treatment on the mixed solution containing the first solution and the second solution, and the heating rate of the thermal treatment is in the range of 2° C./minute to 10° C./minute. Therefore, during the reaction of the cation in the first solution and the anion in the second solution, reduction in the reaction temperature due to factors such as heat absorption and temperature difference of the first solution and the second solution before mixing can be prevented. As a result, the quantum yield of the quantum dot can be increased.

A light-emitting material of the disclosure includes a plurality of quantum dots made in the aforementioned manufacturing method.

A light-emitting device of the disclosure includes a light source and an encapsulating material containing the light-emitting material, wherein the encapsulating material encloses the light source.

The display apparatus of the disclosure includes at least one selected from the group consisting of a television, digital camera, digital photo frame, mobile phone, notebook personal computer, mobile computer, a monitor used in, for instance, a computer, a portable game console, portable information terminal, audio reproduction apparatus, game console, and car display.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1:
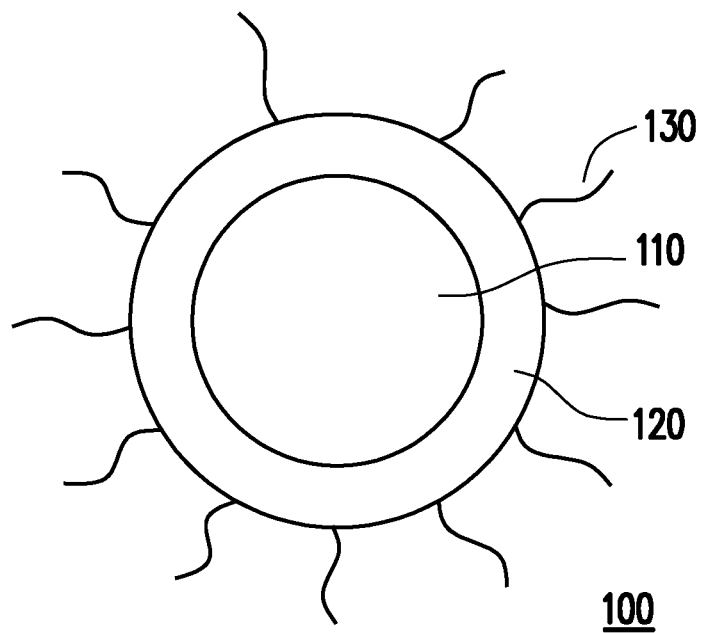
FIG. 1 is a cross section of a quantum dot according to an embodiment of the disclosure.

FIG. 1 is a cross section of a quantum dot according to an embodiment of the disclosure.

Referring to FIG. 1, a quantum dot 100 of the present embodiment can include a core 110, a first shell 120, and a ligand 130. A particle size of the quantum dot 100 can be greater than or equal to 10 nm.

The core 110 can be located at a center of the quantum dot 100, and can substantially be spherical. The core 110 can include at least one cation and at least one anion. The cation can include an element in Group XII and/or an element in Group XIII of the Periodic Table of Elements. For instance, the cation of the core 110 can include cadmium (Cd), zinc (Zn), mercury (Hg), aluminum (Al), gallium (Ga), and/or indium (In). The anion of the core 110 can include an element in Group XV and/or an element in Group XVI. For instance, the anion can include sulfur (S), selenium (Se), tellurium (Te), nitrogen (N), phosphorus (P), and/or arsenic (As). In some embodiments, the core can be a binary core (including, for instance, CdSe, CdTe, CdS, ZnS, ZnSe, ZnTe, HgS, HgSe, HgTe, GaN, GaP, GaAs, AlN, AlP, AlAs, InN, InP, InAs etc.), a ternary core (including, for instance, CdZnS, ZnSeTe, CdSeS, CdZnSe, CdZnTe, CdSeTe, CdSTe, ZnSeS, ZnSTe, HgSeS, HgSeTe, HgSTe, CdHgS, CdHgSe, CdHgTe, HgZnS, HgZnSe, HgZnTe, GaNP, GaNAs, GaPAs, AlNP, AlNAs, AlPAs, InNP, InNAs, InPAs etc.), or a quaternary core (including, for instance, CdZnSeS, CdZnSeTe, CdZnSTe, CdHgSeS, CdHgSeTe, CdHgSTe, HgZnSeS, HgZnSeTe, HgZnSTe, GaAlNP, GaAlNAs, GaAlPAs, GaInNP, GaInNAs, GaInPAs, InAlNP, InAlNAs, InAlPAs etc.).

The first shell 120 can substantially enclose the surface of the core 110 and can include at least one cation and at least one anion. The cation of the first shell 120 can include an element in Group XII such as zinc (Zn) and/or cadmium (Cd). The anion of the first shell 120 can include an element in Group XVI such as sulfur (S). In some embodiments, the first shell can be a binary shell (including, for instance, ZnS) or a ternary shell (including, for instance, ZnCdS).

In some embodiments, the first shell 120 can have a gradient composition. Different portions of the first shell 120 can have different cation contents and/or anion contents. In other words, the cation content and/or the anion content can vary from an innermost portion of the first shell 120 to an outermost portion of the first shell 120. For instance, when the first shell 120 includes zinc (Zn), cadmium (Cd), and sulfur (S), a zinc concentration in the first shell 120 can substantially be the lowest at the innermost portion and can be substantially the highest at the outermost portion. In other words, the zinc concentration can increase substantially in proportion to an increase of a distance from the core 110.

In some embodiments, the first shell 120 can have a substantially constant (or same) composition. For instance, each portion of the first shell 120 can have a substantially constant (or same) cation content and/or a substantially constant (or same) anion content.

Figure 2:
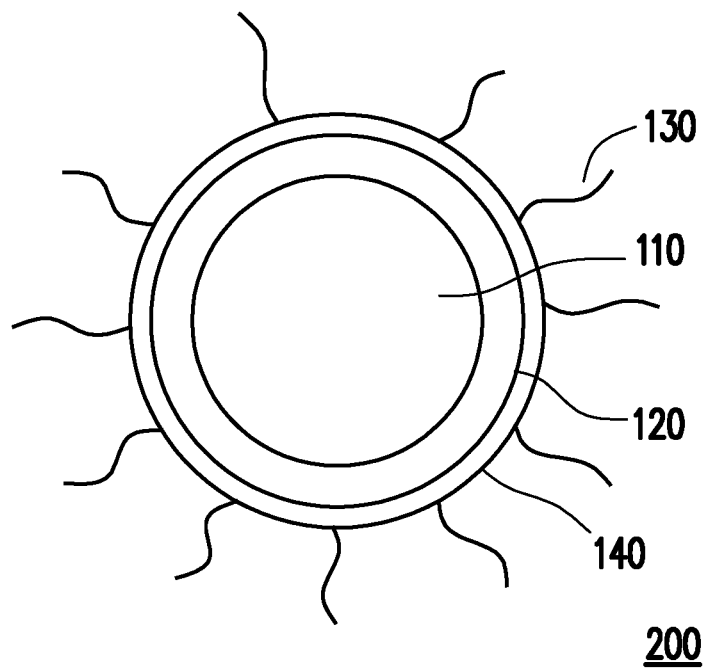
FIG. 2 is a cross section of a quantum dot according to another embodiment of the disclosure.

FIG. 2 is a cross section of a quantum dot according to another embodiment of the disclosure.

Referring to FIG. 2, the quantum dot 200 can further include a second shell 140 substantially enclosing a surface of the first shell 120. In this case, a particle size of the quantum dot 200 can be increased due to the second shell 140. The second shell 140 can specifically (or additionally) protect the core 110. Therefore, in comparison to a quantum dot without the second shell, the quantum dot 200 having the second shell can ensure higher quantum yield over a long period of time.

The second shell 140 can include at least one cation and at least one anion. The cation of the second shell 140 can include a Group XII element (such as zinc), and the anion of the second shell 140 can include an element in Group XVI (such as sulfur). In some embodiments, the second shell 140 can be a binary shell (including, for instance, ZnS). The second shell 140 can have a substantially constant (or same) composition. For instance, each portion of the second shell 140 can have a substantially constant (or same) cation content and/or a substantially constant (or same) anion content. The second shell 140 can have a thickness of about 1.6 nm. In some embodiments, the second shell 140 can substantially be different from the first shell 120.

The ligand 130 can include an organic functional group. The ligand 130 can be provided on a surface of the first shell 120 or a surface of the second shell 140 such that the ligand 130 can be chemically bonded to the surface of the first shell 120 or the surface of the second shell 140. The organic functional group of the ligand 130 can include, for instance, oleic acid, stearic acid, lauric acid, trioctylphosphine (TOP), tributylphosphine, triphenylphosphine, octadecene (ODE), or dioctylamine.

In some embodiments, the ligand 130 including oleic acid can be provided on the surface of the first shell 120. As a result, a relatively strong chemical bonding can be formed between the first shell 120 and the ligand 130, and the ligand 130 may not be detached from the surface of the first shell 120 during a repeated cleaning process during manufacture of the quantum dot 100.

In some embodiments, the ligand 130 including both oleic acid and trioctylphosphine can be provided on the surface of the second shell 140. In this case, even if a chemical bonding between the second shell 140 and the ligand 130 becomes weak, the quantum dot 200 can have a continuously higher quantum yield due to the second shell 140. In alternative embodiments, the ligand 130 including oleic acid only can be formed on the surface of the second shell 140, and therefore the quantum dot 200 can have a more improved quantum yield due to a relatively strong chemical bonding between the second shell 140 and the ligand 130. The quantum dot 200 can exhibit various colors in accordance with its composition. Therefore, the quantum dot 200 can emit emission lights with different colors, such as blue, red, or green. In some embodiments, the quantum dot 200 can be a blue quantum dot or a green quantum dot.

In particular, when the quantum dot 200 receives an incident light having a wavelength equal to or greater than 350 nm and less than the emission wavelength, such as an incident light having a wavelength of 390 nm to 500 nm, the quantum dot 200 can emit light having a wavelength of 400 nm to 700 nm. Moreover, a full width at half maximum (FWHM) of the wave crest of the light emitted by the quantum dot 200 is, for instance, 20 nm to 60 nm. In some embodiments, a wavelength of the light emitted by a green quantum dot is, for instance, 500 nm to 600 nm, or 510 nm to 560 nm, or 520 nm to 550 nm. In other embodiments, a wavelength of the light emitted by a red quantum dot is, for instance, 600 nm to 700 nm, or 605 nm to 680 nm, or 610 nm to 660 nm. A wavelength of the light emitted by a blue quantum dot is, for instance, 400 nm to 500 nm, or 430 nm to 470 nm, or 440 nm to 460 nm. For instance, the wavelength, intensity, and FWHM of the light emitted by the quantum dot can be obtained by performing photoluminescence analysis with a photoluminescence analyzer (made by Horiba, model: FluoroMax-3).

In some embodiments, an average particle size of the red quantum dot is, for instance, 3 nm to 25 nm, or 4 nm to 15 nm, or 5 nm to 10 nm. An average particle size of the green quantum dot is, for instance, 2 nm to 20 nm, or 3 nm to 15 nm, or 4 nm to 9 nm. An average particle size of the blue quantum dot is 1 nm to 15 nm, or 2 nm to 10 nm, or 2 nm to 8 nm.

Figure 3:
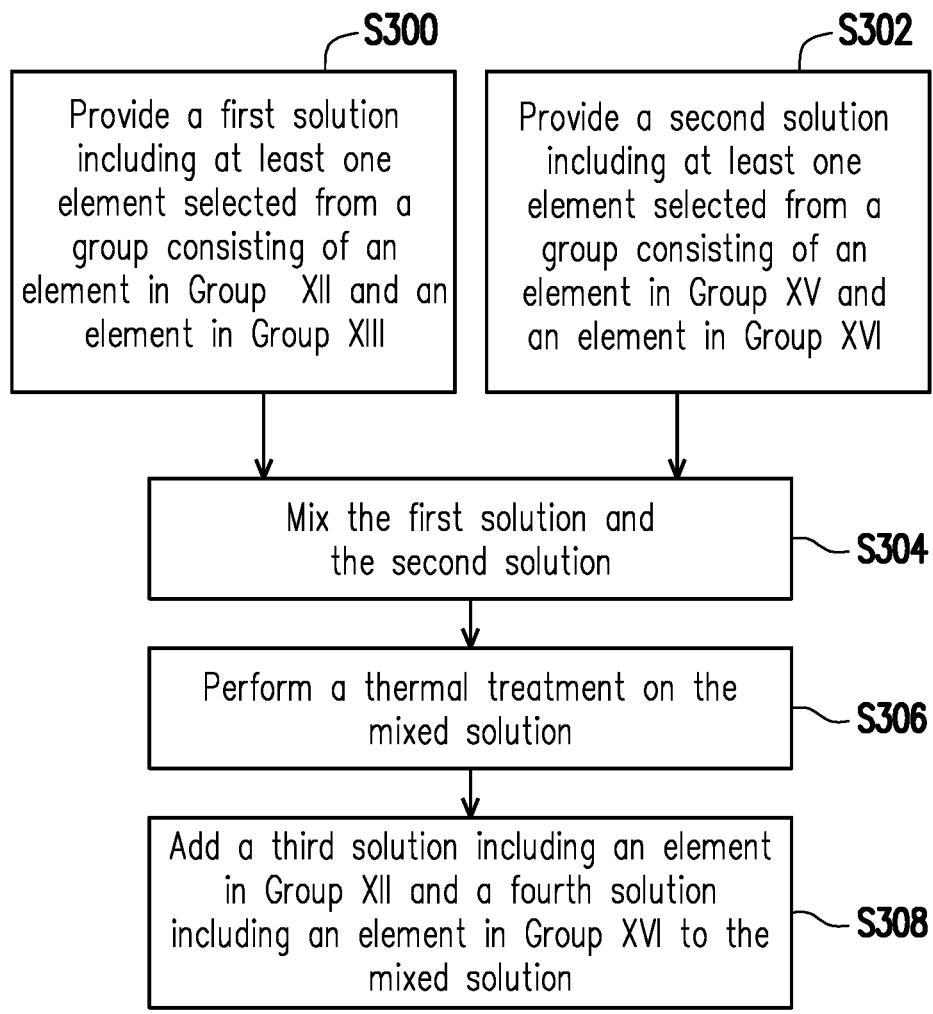
FIG. 3 is a flow chart of a manufacturing method of a quantum dot according to an embodiment of the disclosure.

FIG. 3 is a flow chart of a manufacturing method of a quantum dot according to an embodiment of the disclosure. Referring to FIG. 1 and FIG. 3, the manufacturing method of a quantum dot of the present embodiment includes the following steps.

A step S300 is performed to provide a first solution including at least one element selected from the group consisting of an element in Group XII and an element in Group XIII. Specifically, the element in Group XII or the element in Group XIII is present in the first solution in a form of a cation. For instance, the element in Group XII in the first solution can include zinc, cadmium, mercury, or a combination thereof. The element in Group XIII in the first solution can include aluminum, gallium, indium, or a combination thereof. In some embodiments, the element in Group XII (or a precursor thereof) or the element in Group XIII (or a precursor thereof) can be mixed with an organic acid to form a first solution. The organic acid can include oleic acid (OA), stearic acid, lauric acid, or a combination thereof. In some embodiments, the first solution has a first temperature. A range of the first temperature can be 230° C.

to 330° C. In other embodiments, a range of the first temperature can be 240° C. to 320° C., such as 250° C. to 320° C.

A step S302 is performed to provide a second solution including at least one element selected from the group consisting of an element in Group XV and an element in Group XVI. Specifically, the element in Group XV or the element in Group XVI is present in the second solution in a form of an anion. For instance, the element in Group XV in the second solution can include at least one of nitrogen, phosphorous, and arsenic. The element in Group XVI in the second solution can include at least one of oxygen, sulfur, selenium, and tellurium. In some embodiments, the element in Group XV (or a precursor thereof) or the element in Group XVI (or a precursor thereof) can be mixed with an organic solution to form a second solution. The organic solution can include tri-n-octylphosphine (TOP), octadecene (ODE), tributylphosphine, dioctylamine, or a combination thereof. In some embodiments, the step S302 can be performed at room temperature. A range of the room temperature can be 20° C. to 30° C.

In some embodiments, the step S300 and the step S302 can be performed at the same time. In other embodiments, the step S300 can be performed before or after the step S302, and the invention is not limited to the order of the step S300 and the step S302.

A step S304 is performed to mix the first solution and the second solution. As a result, a mixed solution including a core of a quantum dot can be formed. It should be mentioned that, the core of the quantum dot here is the core 110 of the quantum dot 100 in FIG. 1 or the quantum dot 200 in FIG. 2. Specifically, in the step S304, the cation in the first solution and the anion in the second solution are reacted to form the core 110. In particular, at least one cation and at least one anion are reacted such that the core 110 is formed to be a binary core, a ternary core, a quaternary core, or a core consisted of more components.

In the step S304, the reaction of forming the core 110 is an endothermic reaction. In other words, a temperature of the mixed solution formed by the first solution and the second solution is lower than a temperature of the first solution and a temperature of the second solution before mixing. In some embodiments, the temperature of the first solution is 230° C. to 330° C., and the temperature of the second solution is room temperature. As a result of the endothermic reaction and the temperature difference between the first solution and the second solution, the temperature of the mixed solution formed by mixing the first solution and the second solution is less than the temperature of the first solution. For instance, a range of temperature difference of the mixed solution with respect to the first solution can be 5° C. to 30° C.

A step S306 is performed to perform a thermal treatment on the mixed solution. As a result, the temperature of the mixed solution can be increased, so as to return to the higher one of the temperature of the first solution and the temperature of the second solution. In some embodiments, the temperature of the mixed solution after the thermal treatment can be higher than the temperature of the first solution and the temperature of the second solution before mixing. A range of a heating rate of the thermal treatment is 2° C./min to 10° C./min. In some embodiments, a range of the heating rate of the thermal treatment can be 3° C./minute to 8° C./minute. In other embodiments, a range of the heating rate of the thermal treatment is 3.5° C./minute to 7.5° C./minute.

Moreover, an operation time of the thermal treatment can be in the range of 1 minute to 15 minutes, or in the range of 1.5 minutes to 10 minutes.

In some embodiments, a starting point of the step S306 can be prior to an end point of the step S304. In other words, a thermal treatment can be performed on the mixed solution while mixing the first solution and the second solution. In other embodiments, the starting point of the step S306 can also be later than the end point of the step S304. In other words, a thermal treatment can be performed on the mixed solution after the mixing of the first solution and the second solution is complete. In some embodiments, a thermal treatment can be performed on the mixed solution immediately after the mixed solution is formed. In other embodiments, a thermal treatment can be performed on the mixed solution to increase the temperature of the mixed solution to be greater than or equal to the temperature of the first solution, and then the mixed solution is maintained at this temperature.

Next, a step S308 can be performed to add a third solution including an element in Group XII and a fourth solution including an element in Group XVI to the mixed solution. In some embodiments, the element in Group XII in the third solution and the element in Group XVI in the fourth solution are respectively contained in the third solution and the fourth solution in the form of a cation and an anion, and are reacted to form the first shell 120 of the quantum dot 100 (or the quantum dot 200). As a result, the quantum dot 100 (or the quantum dot 200) includes the first shell 120 and the core 110 from outside to inside. The first shell 120 and the core 110 can respectively be single-layer structures, and can respectively be multilayer structures as well.

In some embodiments, the third solution and the fourth solution can be sequentially added to the mixed solution formed in the step S306.

In some embodiments, the step S308 can be performed at a second temperature. In some embodiments, a range of the second temperature can be 230° C. to 330° C. In other embodiments, a range of the second temperature can be 240° C. to 320° C., such as 250° C. to 320° C. In some embodiments, the second temperature can be higher than the first temperature. During the forming process of the first shell 120, by performing heating, the semiconductor material forming the first shell 120 can be successfully formed on the surface of the core 110, rather than being dispersed in the solution. As a result, the first shell 120 of the quantum dot can preferably protect the core 110 to prevent damage to the core 110 by moisture, oxygen, and blue light. Therefore, a reliability of the quantum dot can be improved.

Next, the solution obtained in the step S308 is precipitated, centrifugally separated, and cleaned with a polar solvent such as acetone or ethanol, in order to obtain the quantum dot of the present embodiment.

In some embodiments, the organic group of the aforementioned ligand 130 can be referred to as a sealing agent and can inhibit the gathering of a plurality of the quantum dots and can suitably isolate the quantum dot from the external environment. In other embodiments, the surface of the quantum dot can also be modified by adding an additional sealing agent to form the ligand 130 on the surface of the first shell 120. The sealing agent can be formed by a Lewis base compound. In some embodiments, a hydrocarbon in an inert solvent can be diluted to form the Lewis base compound. The sealing agent can include a monodentate ligand or a polydentate ligand, such as phosphine, phosphine oxide, alkylphosphonic acid, alkylamine, arylamine, pyridine, long-chain fatty acid, thiophene, or a combination thereof. For instance, the phosphorous can include, for instance, trioctylphosphine, triphenylphosphine, and tert-butylphosphine. The phosphine oxide can include, for instance, trioctylphosphine oxide and triphenylphosphine oxide. The alkylamine can include, for instance, hexadecylamine and octylamine.

Figure 4:
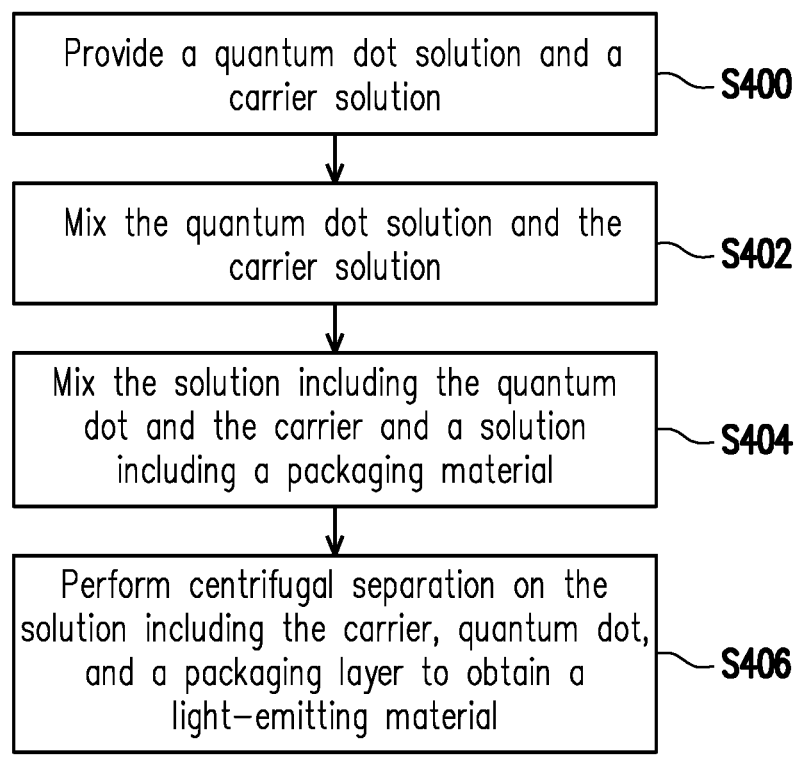
FIG. 4 is a flow chart of a manufacturing method of a light-emitting material according to an embodiment of the disclosure.

FIG. 4 is a flow chart of a manufacturing method of a light-emitting material according to an embodiment of the disclosure. Referring to FIG. 4, in some embodiments, the method of manufacturing a light-emitting material using the quantum dot can include the following steps.

A step S400 is performed to provide a quantum dot solution and a carrier solution. The quantum dot solution contains a plurality of the aforementioned quantum dots and a solvent for dispersing the quantum dots. Similarly, the carrier solution contains a plurality of carriers and a solvent for dispersing the carriers. For instance, the solvent of the quantum dot solution and the solvent of the carrier solution can respectively include n-hexane. In some embodiments, a weight percentage of the quantum dots in the quantum dot solution is 0.1% to 5%. A weight percentage of the carriers in the carrier solution is 0.5% to 10%.

In some embodiments, a material of the carrier can be at least one selected from the group consisting of organic polymer, inorganic polymer, water-soluble polymer, organic solvent-soluble polymer, biopolymer, and synthetic polymer. For instance, the material of the carrier can be at least one selected from the group consisting of polysiloxane, polyacrylate, polycarbonate, polystyrene, polyethylene, polypropylene, polyketide, polyetheretherketone, polyester, polyamide, polyimide, polyacrylamide, polyolefin, polyacetylene, polyisoprene, polybutadiene, polyvinylidene difluoride (PVDF), polyvinyl chloride (PVC), ethylene vinyl acetate (EVA), polyethylene terephthalate (PET), polyurethane, and cellulose polymer. In some embodiments, the material of the carrier can also be an inorganic medium such as at least one selected from the group consisting of silica gel, bentonite, glass, water glass, quartz, kaoline, silicon dioxide, aluminum oxide, and zinc oxide.

Water glass is a material formed by combining alkali metal oxide and silicon dioxide. Water glass can be categorized into lithium water glass, sodium water glass, and potassium water glass based on the type of the alkali metal, and the molecular formulas thereof are respectively $Li_2O.nSiO_2$, $Na_2O.nSiO_2$, and $K_2O.nSiO_2$. n represents a water glass modulus, and is a molecular ratio (or molar ratio) of silicon oxide with respect to alkali metal oxide in the water glass. n can be ranged from 1.5 to 4.0, or from 2.0 to 3.5.

The polysiloxane is obtained from a hydrolysis condensation reaction by adding water to the siloxane compound shown in formula (I) below:

$R^a{}_nSi(OR^b)_{4-n}$   n=0 to 3   formula (I);

$R^a$ represents a $C_2$ to $C_{15}$ aromatic group and $R^b$ represents a $C_1$ to $C_5$ alkyl group. The aromatic group is (but not limited to), for instance, a phenyl group, a tolyl group, p-hydroxyphenyl, 1-(p-hydroxyphenyl)ethyl, 2-(p-hydroxyphenyl)ethyl, 4-hydroxy-5-(p-hydroxyphenylcarbonyloxy)pentyl, or a naphthyl group. The alkyl group is (but not limited to), for instance, a methyl group, an ethyl group, an n-propyl group, an isopropyl group, or an n-butyl group. In some embodiments, the polysiloxane can be obtained from the hydrolysis condensation reaction of tetraethoxysilane (TEOS).

An average particle size of the carrier is, for instance, 0.1 μm to 25 or 0.3 μm to 15 μm, or 0.5 μm to 10 μm. In some embodiments, the material of the carrier is porous. An average surface pore size of the porous carrier is 3 nm to 100 nm. In some embodiments, the quantum dot is a green quantum dot, and an average surface pore size of the porous carrier is, for instance, 5 nm to 30 nm, or 5 nm to 25 nm, or 5 nm to 20 nm. In other embodiments, the quantum dot is a red quantum dot, and an average surface pore size of the porous carrier is, for instance, 7 nm to 40 nm, or 7 nm to 35 nm, or 7 nm to 30 nm. Moreover, when the quantum dot is a blue quantum dot, an average surface pore size of the porous carrier is, for instance, 3 nm to 25 nm, or 3 nm to 20 nm, or 3 nm to 15 nm. A specific surface area of the porous carrier is, for instance, 100 $m^2/g$ to 1000 $m^2/g$. In some embodiments, the porous carrier is a porous microparticle. The porous microparticle can be a silicon dioxide particle. The carrier can be a lipophilic carrier. For instance, the porous microparticle can be a lipophilic silicon dioxide particle. The lipophilic silicon dioxide particle is obtained by modifying the silicon dioxide particle with a silane compound shown in formula (II) below:

$R^c{}_mSi(OR^d)_{4-m}$   m=1 to 3   formula (II);

$R^c$ represents a $C_3$ to $C_{20}$ alkyl group and $R^d$ represents a $C_1$ to $C_5$ alkyl group. In some embodiments, $R^c$ is an octyl group, nonyl group, or decyl group. $R^d$ is (but not limited to), for instance, a methyl group, an ethyl group, an n-propyl group, an isopropyl group, or an n-butyl group.

A porous carrier consisted of silicon dioxide can have an average particle diameter of 1 μm to 5 μm, an average surface pore size of 5 nm to 15 nm, and a specific surface area of 500 $m^2/g$ to 900 $m^2/g$; an average particle diameter of 1 μm to 5 μm, an average surface pore size of 10 nm to 30 nm, and a specific surface area of 250 $m^2/g$ to 750 $m^2/g$; an average particle diameter of 0.5 μm to 1.5 μm, an average surface pore size of 5 nm to 15 nm, and a specific surface area of 200 $m^2/g$ to 600 $m^2/g$; or an average particle diameter of 0.1 μm to 0.5 μm, an average surface pore size of 3 nm to 12 nm, and a specific surface area of 100 $m^2/g$ to 500 $m^2/g$.

A step S402 is performed to mix the quantum dot solution and the carrier solution. In the step S402, the quantum dot in the quantum dot solution can be attached to the carrier in the carrier solution. In some embodiments, the carrier is the porous carrier, which is used for the quantum dots to be uniformly and stably attached to the carriers. Next, a solution including the quantum dot and the carrier can be left to stand, and then centrifugation and filtering are performed to obtain a carrier to which the quantum dot is attached.

Next, a step S404 is performed to mix the solution including the quantum dot and the carrier and a solution including a packaging material. In the step S404, the packaging material can cover a surface of the carrier to which the quantum dot is attached to form a packaging layer. In some embodiments, a thickness of the packaging layer can be 0.1 nm to 20 nm.

The packaging material can be at least one selected from the group consisting of organic polymer, inorganic polymer, water-soluble polymer, organic solvent-soluble polymer, biopolymer, and synthetic polymer. For instance, the packaging material can be at least one selected from the group consisting of polysiloxane, polyacrylate, polycarbonate, polystyrene, polyethylene, polypropylene, polyketide, polyetheretherketone, polyester, polyamide, polyimide, polyacrylamide, polyolefin, polyacetylene, polyisoprene, polybutadiene, polyvinylidene difluoride (PVDF), polyvinyl chloride (PVC), ethylene vinyl acetate (EVA), polyethylene terephthalate (PET), polyurethane, and cellulose polymer. In some embodiments, the packaging material can also be an inorganic medium such as at least one selected from the group consisting of silica gel, bentonite, glass, quartz, kaoline, silicon dioxide, aluminum oxide, and zinc oxide. In some embodiments, the packaging layer and the carrier can be formed by the same material. In other embodiments, the packaging layer and the carrier can also be formed by different materials.

Next, a step S406 is performed to perform centrifugal separation on the solution including the carrier, quantum dot, and packaging layer to obtain a light-emitting material. In other words, the light-emitting material can include the carrier, quantum dot, and packaging layer. The quantum dot is attached to the surface of the carrier, and the packaging layer encloses the quantum dot and the carrier.

In some embodiments, a weight percentage of the quantum dot in the light-emitting material can be 0.1% to 20%. In other embodiments, a weight percentage of the quantum dot in the light-emitting material can also be 0.2% to 15%, or 0.3% to 10%. When the weight percentage of the quantum dot in the light-emitting material is less than 0.1%, a concentration of the quantum dot in the light-emitting material is too low, such that an overall light-emitting efficiency of the light-emitting material is poor. When the weight percentage of the quantum dot in the light-emitting material is higher than 20%, a self-absorption readily occurs to the quantum dot, such that the overall light-emitting efficiency of the light-emitting material is reduced, such that a red shift occurs to the emitted light. For instance, the weight percentage can be measured by an inductively-coupled plasma (ICP) spectral analysis method.

In some embodiments, the light-emitting material can be applied in a encapsulating material of a light-emitting device. For instance, the encapsulating material of the light-emitting device can include, for instance, an epoxy resin, polysiloxane resin, acrylate resin, or glass. In a light-emitting device, the encapsulating material encloses the light source (such as LED, laser source, arc lamp, and blackbody light source) such that the primary light generated by the light source can excite the quantum dot in the encapsulating material to generate a secondary light. A wave band of a primary light can be different from a wave band of the secondary light. In other words, a color of the primary light can be different from a color of the secondary light. Moreover, predetermined intensity and wavelength of the light emitted by the entire light-emitting device can be satisfied by a suitable mixture of the primary light and the secondary light according to the colors thereof. It should be mentioned that, the light emitted by the light-emitting device can be only the light emitted by the quantum dot (i.e., secondary light), or a mixture of the light emitted by the light source and the light emitted by the quantum dot (i.e., a mixture of the primary light and the secondary light). In some embodiments, the light-emitting material can include a single type of the quantum dot, or a plurality of types of the quantum dot having different colors.

A light-emitting device (such as LED) using the light-emitting material of the present embodiment can be used as the light-emitting components of a backlight unit or other light-emitting apparatuses. Moreover, a plurality of LEDs using the light-emitting material of the present embodiment can also be arranged in a quantum dot light-emitting diode (QLED) display equipment, and each LED in the QLED display equipment is a single pixel.

In some embodiments, the light-emitting device can be applied in various display apparatuses. The display apparatus can be, for instance, a television (also referred to as TV or TV receiver), digital camera, digital photo frame, mobile phone, notebook personal computer, mobile computer, a monitor used in, for instance, a computer, a portable game console, portable information terminal, audio reproduction apparatus, game console, and car display.

It should be mentioned that, the light-emitting material of the present embodiment is not limited to the encapsulating material for an LED, and can also be used in, for instance, an optical film, an optical sheet, a transparent tube member, an optical member, a color conversion material, an optical material, ink, and label agent.

Based on the above, the manufacturing method of a quantum dot of the disclosure includes performing the thermal treatment on the mixed solution containing the first solution and the second solution, and the heating rate of the thermal treatment is in the range of 2° C./minute to 10° C./minute. Therefore, during the reaction of the cation in the first solution and the anion in the second solution, reduction in the reaction temperature due to factors such as heat absorption and temperature difference of the first solution and the second solution before mixing can be prevented. As a result, the quantum yield of the quantum dot can be increased.

An experimental example and a comparative example are provided below to verify the effect of the invention, but the invention is not limited to the following content.

EXPERIMENTAL EXAMPLE

First, a first solution was provided. 18 mg of cadmium oxide, 813 mg of zinc acetate, and 7 mg of oleic acid were added into a three-necked flask. Next, 15 mL of octadecene was added into the three-necked flask. Solution in the three-necked flask reacts, and being mixed by heating in vacuum at 120° C. Next, the three-necked flask was filled with nitrogen gas, and a temperature in the three-necked flask was increased to 290° C.

A second solution was provided at the room temperature, and the first solution and the second solution were mixed, and a thermal treatment was performed on the mixed solution of the first solution and the second solution. 2.1 mL and 0.001 mol of trioctyl selenide (TOP-Se) and 58 mg of sulfur were provided at the room temperature and added into the three-necked flask, and the temperature of the solution in the three-necked flask was returned to 290° C. at a heating rate of 5.96° C./minute, and the mixture was reacted at a constant temperature of 290° C.

A third solution and a fourth solution were added to the aforementioned mixed solution. The third solution includes 525 mg of zinc acetate, 1.83 mL of oleic acid, and 4 mL of octadecene. The fourth solution includes 309 mg of sulfur and 5 mL of trioctylphosphine. Next, the solution was stirred to generate a yellow-green suspension, and then the suspension was cooled and precipitated using 300 mL of ethanol. The centrifugally separated product after precipitation was the green quantum dot. A peak value of the light emitted by the green quantum dot was 525 nm, and a FWHM thereof was 22 nm.

The quantum dot were mixed with n-hexane to form a quantum dot solution. A weight percentage of the quantum dots in the quantum dot solution was 1%. Moreover, the porous silicon dioxide particle carrier was mixed with n-hexane to prepare a carrier solution. An average diameter of the porous silicon dioxide particle was 3 μm, an average surface pore size thereof was 10 nm, and a specific surface area thereof was 700 m$^2$/g. Moreover, the porous silicon dioxide particle was modified to be lipophilic. In the carrier solution, a weight percentage of the porous silicon dioxide particles was 5%.

0.25 g of the quantum dot solution and 5 g of the carrier solution were mixed and left to stand for 10 minutes. Next, centrifugal filtration was performed on the solution including the quantum dot and the carrier to obtain a porous silicon dioxide particle to which the quantum dot was attached, i.e., the carrier to which the quantum dot was attached. Next, the carrier to which the quantum dot was attached was added in 250 g of ethanol and evenly dispersed.

A solution including a packaging material was provided, wherein the solution included 0.5 g of tetraethoxysilane (TEOS) and 2.5 g of ammonia solution ($NH_4OH$) having a weight percentage of 29%. The solution including the packaging material was added in an ethanol solution including the carrier to which the quantum dot was attached, and the mixture was stirred at room temperature for 4 hours to form a packaging layer on the surface of the carrier to which a quantum dot was attached. A pH value of the solution including the carrier, quantum dot, and packaging layer was ranged from 10 to 11. Next, centrifugal separation was performed on the solution including the carrier, quantum dot, and packaging layer, and then the solution was cleaned with pure water 3 times then dried to obtain 0.2778 g of a micron-meter level light-emitting material.

COMPARATIVE EXAMPLE

A manufacturing method of the quantum dot of the comparative example is similar to the manufacturing method of the quantum dot of the experimental example. The difference between the two is only in that the heating rate of the thermal treatment of the comparative example was 1.86° C./minutes and the heating rate of the thermal treatment of the experimental example was 5.96° C./minute.

Quantum Yield

Quantum efficiencies of the experimental example and the comparative example were respectively measured by the following method: the micron-meter level light-emitting materials of the experimental example and the comparative example respectively obtained by the manufacturing method mentioned above were used for the measurement. The light-emitting materials were dispersed in hexane used as a solvent to prepare a sample solution having a transmittance (%) ranged from 71% to 79% with respect to blue light (wavelength of 450 nm). Laser integral area and radiation integral area of the sample solution and the solvent (hexane, blank experiment) were respectively measured using a photoluminescence analyzer (made by HORIBA Corporation, model: FluoroMax-3) with an integrating sphere (HORIBA QUANTA-φ F-3029), and then a quantum yield of the sample solution was calculated via the following formula:

$$\Phi = \frac{E_c - E_a}{L_a - L_c}$$

(Φ: quantum yield, Ec: sample solution radiation integral area, Ea: hexane radiation integral area, Lc: sample solution laser integral area, La: hexane laser integral area).

The quantum yield of the quantum dot of the experimental example was calculated to be 51%, and the quantum yield of the quantum dot of the comparative example was calculated to be 43%. It is verified that, increasing the heating rate of the thermal treatment to the range of 2° C./minute to 10° C./minute can improve the quantum yield of the quantum dot.

Although the disclosure has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A manufacturing method of a quantum dot, comprising:
providing a first solution comprising at least one element selected from a group consisting of an element in Group XII and an element in Group XIII;
providing a second solution comprising at least one element selected from a group consisting of an element in Group XV and an element in Group XVI, and an organic solution, wherein the organic solution comprises tri-n-octylphosphine, octadecene, tributylphosphine, dioctylamine, or a combination thereof;
mixing the first solution and the second solution to form a mixed solution; and
performing a thermal treatment on the mixed solution, so as to form a quantum dot, wherein a range of a heating rate of the thermal treatment is 2° C./min to 10° C./min.

2. The manufacturing method of the quantum dot of claim 1, wherein the element in Group XII comprises zinc, cadmium, mercury, or a combination thereof, and the element in Group XIII comprises aluminum, gallium, indium, or a combination thereof.

3. The manufacturing method of the quantum dot of claim 1, wherein the element in Group XV comprises nitrogen, phosphorous, arsenic, or a combination thereof, and the element in Group XVI comprises oxygen, sulfur, selenium, tellurium, or a combination thereof.

4. The manufacturing method of the quantum dot of claim 1, wherein the first solution further comprises an organic acid, and the organic acid comprises oleic acid, stearic acid, lauric acid, or a combination thereof.

5. The manufacturing method of the quantum dot of claim 1, wherein the first solution and the second solution are mixed at a first temperature of the first solution, and the step of performing the thermal treatment comprises increasing a temperature of the mixed solution to greater than or equal to the first temperature.

6. The manufacturing method of the quantum dot of claim 5, wherein a range of the first temperature is 250° C. to 330° C.

7. The manufacturing method of the quantum dot of claim 1, wherein the first solution and the second solution are mixed when a temperature of the second solution is 20° C. to 30° C.

8. The manufacturing method of the quantum dot of claim 1, wherein the thermal treatment is immediately performed after the mixed solution is formed.

9. The manufacturing method of the quantum dot of claim 1, wherein the range of the heating rate of the thermal treatment is 3° C./minute to 8° C./minute.

10. The manufacturing method of the quantum dot of claim 1, wherein the range of the heating rate of the thermal treatment is 3.5° C./minute to 7.5° C./minute.

11. The manufacturing method of the quantum dot of claim 1, wherein during the thermal treatment step, the temperature of the mixed solution is increased to greater than or equal to the first temperature, and then the temperature is maintained.

12. The manufacturing method of the quantum dot of claim 1, further comprising:
   adding a third solution comprising an element in Group XII and a fourth solution comprising an element in Group XVI to the mixed solution.

13. The manufacturing method of the quantum dot of claim 12, wherein the step of adding the third solution and the fourth solution to the mixed solution is performed at 230° C. to 330° C.

14. A light-emitting material, comprising:
   a plurality of quantum dots, wherein the quantum dots are made by the manufacturing method of the quantum dot of claim 1.

15. A light-emitting device, comprising:
   a light source, and
   an encapsulating material containing the light-emitting material of claim 14, wherein the encapsulating material encloses the light source.

16. A display apparatus, comprising:
   the light-emitting device of claim 15,
   wherein the display apparatus is at least one selected from the group consisting of a television, a digital camera, a digital photo frame, a mobile phone, a notebook personal computer, a mobile computer, a monitor used in a computer, a portable game console, a portable information terminal, an audio reproduction apparatus, a game console, and a car display.

* * * * *